United States Patent [19]

Marguinaud et al.

[11] 4,412,181

[45] Oct. 25, 1983

[54] PROCESS FOR THE DEMODULATION OF AN AMPLITUDE MODULATED SIGNAL AND DEMODULATOR PERFORMING THIS PROCESS

[75] Inventors: Andre Marguinaud; Gerard Sorton, both of Paris, France

[73] Assignee: Thomson-CSF, Paris, France

[21] Appl. No.: 248,287

[22] Filed: Mar. 27, 1981

[30] Foreign Application Priority Data

Apr. 1, 1980 [FR] France ................................ 80 07297

[51] Int. Cl.³ ............................................. H04N 5/04
[52] U.S. Cl. ..................................... 329/50; 329/104; 455/202; 455/337; 375/94
[58] Field of Search ................. 329/50, 104, 106, 107, 329/145; 455/202, 337; 375/94; 358/23, 24, 25

[56] References Cited

U.S. PATENT DOCUMENTS

| | | | |
|---|---|---|---|
| 3,274,503 | 9/1966 | Peterson et al. | 455/337 |
| 3,670,251 | 6/1972 | Shintani et al. | 329/104 |
| 4,121,165 | 10/1978 | Dogliotti et al. | 329/50 |

*Primary Examiner*—Stanley D. Miller
*Assistant Examiner*—S. V. Clark
*Attorney, Agent, or Firm*—Cushman, Darby & Cushman

[57] ABSTRACT

A process for the demodulation of an amplitude modulated signal composed of two suppressed carriers, at a same frequency F and in phase quadrature, which are respectively modulated by two modulation signals, the modulated signal being preceded by a reference signal at frequency F, by sampling the reference signal and the modulated signal, according to a frequency m.F (m being an integer);

determining a polar angle $\psi_t$ of a rotating vector representing the reference signal, at time t, by calculating:

$$\psi_t = arctg \frac{x(t)}{x\left(t - \frac{1}{4F}\right)},$$

where x(t) and x(t−(1/4F)) are the values of two successive samples of the reference signal;

determining polar coordinates $(\rho_t, \theta_t)$ of a rotating vector representing the modulated signal, at time t, by calculating:

$$\rho_t = \sqrt{y^2\left(t - \frac{1}{4F}\right) + y^2(t)}$$

$$\theta_t = arctg \frac{y(t)}{y\left(t - \frac{1}{4F}\right)}$$

where y(t) and y(t−(1/4F)) are values of two successive samples of the modulated signal, calculating $\gamma = \theta_t - \omega_t - \phi_o$, where $\phi_o$ is the phase displacement between the reference signal and one of the carriers, calculating $\alpha = \rho_t \cdot \cos \gamma$ $\beta = \rho_t \cdot \sin \gamma$ and generating two signals whose instantaneous amplitudes are $\alpha$ and $\lambda\beta$.

5 Claims, 1 Drawing Figure

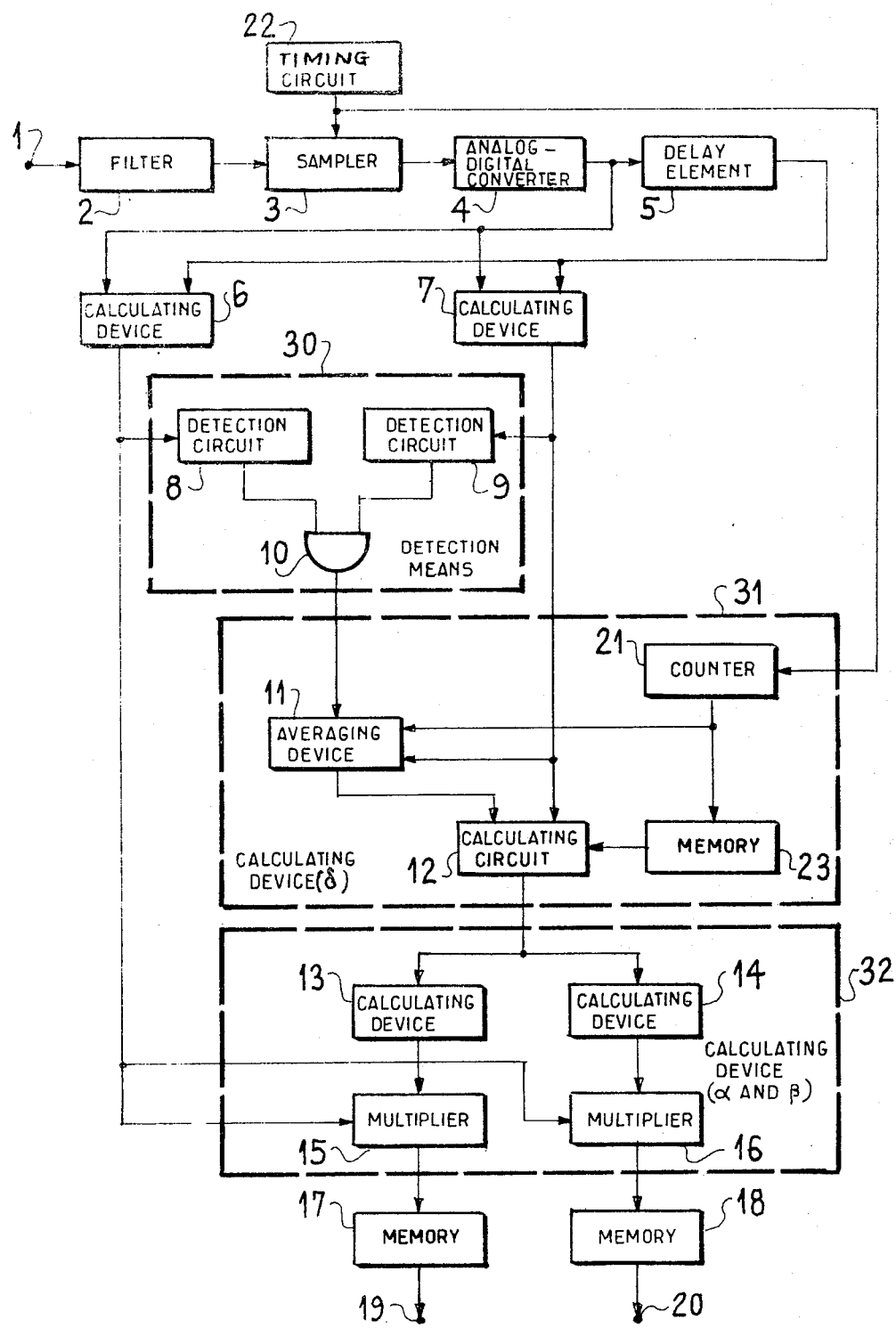

… … …

PROCESS FOR THE DEMODULATION OF AN AMPLITUDE MODULATED SIGNAL AND DEMODULATOR PERFORMING THIS PROCESS

BACKGROUND OF THE INVENTION

The present invention relates to processes for the demodulation of an amplitude modulated signal resulting from the amplitude modulation with suppressed carrier of two carriers in phase quadrature, the demodulators performing these processes and the PAL (phase alternation line) and N.T.S.C (National Television System Committee) television systems comprising such equipment.

PAL and N.T.S.C video frequency signals in each case comprise a luminance signal, mainly located in the low part of the video frequency signal spectrum and a chrominance signal constituted by two amplitude modulations of two subcarriers of the same frequency F, but phase-displaced by 90° from one another.

At present, various systems are known for the demodulation of such a chrominance signal by means of conventional analog demodulator circuits.

BRIEF SUMMARY OF THE INVENTION

The process of the present invention has the advantage that it can be performed with simple digital circuits.

The present invention therefore relates to a process for the demodulation of an amplitude modulated signal resulting from an amplitude modulation with a suppressed carrier of a first and a second carrier at the same frequency F and in phase quadrature by two modulation signals, the signal to be demodulated being represented by the projection on an OX axis of a vector rotating about a point 0 in an OXY coordinate, comprising sampling the signal according to the frequency mF (m positive integer), determining the polar coordinates $(\rho_t, \theta_t)$ of the rotating vector by means of two successive samples of the signal to be demodulated and determining the values $\alpha$ and $\beta$ of the amplitudes of the two modulation signals as a function of the polar coordinates of the rotating vector and the times at which the signal to be demodulated is sampled.

The invention also relates to a demodulator for performing this process.

BRIEF DESCRIPTION OF THE DRAWING AND PREFERRED EMBODIMENTS

The invention is described in greater detail hereinafter relative to non-limitative embodiments and the attached drawing, which shows an embodiment of a demodulator according to the invention.

It is pointed out that in order to make the drawing clearer and simplify the description, the prior art synchronization devices are not shown.

In the drawing, an input terminal 1 for receiving a PAL video frequency signal is coupled to a sampler 3 across a band pass filter 2. A control input of sampler 3 is connected to the output of a clock or timing circuit 22 and to the input of a counter 21. The output of sampler 3 is coupled to the input of a delay element 5 through an analog-digital converter 4. The input of the delay element 5 is also connected to a first input of a calculating device 6 and to a first input of a calculating device 7. The output of delay element 5 is connected to a second input of calculating device 6 and to a second input of calculating device 7. The output of calculating device 6 is coupled to a first input of an AND gate 10, through a detection circuit 8, to a first input of a multiplier 15 and to a first input of a multiplier 16. The second input and the output of the AND gate 10 are respectively connected to the output of calculating device 7 through a detection circuit 9 and to a control input of an averaging device 11. The output of calculating device 7 is also connected to the input of the averaging device 11 and to the first input of a calculating circuit 12, whereof a second input is connected to the output of averaging device 11. A third input of calculating circuit 12 is connected to the output of counter 21 through a memory 23. The output of counter 21 is also connected to a validation input of the circuit of averaging device 11.

The output of calculating circuit 12 is coupled to a circuit input of multiplier 15 through calculating device 13 and to a second input of multiplier 16 through calculating device 14. The output of multiplier 15 is coupled to an output terminal 19 through a memory 17. The output of multiplier 16 is coupled to an output terminal 20 through a memory 18.

Calculating devices 6 and 7 form first calculating means for determining the polar coordinates $(\rho_t, \theta_t)$ of the rotating vector representing the signal present on input terminal 1.

The detection circuits 8, 9 and AND gate 10 constitute the detection means 30 for the detecting of the presence of the burst.

Counter 21, averaging device 11, memory 23 and calculating circuit 12 form a calculating device 31 for calculating a particular value $\gamma$.

The calculating means 13, 14 and multipliers 15, 16 constitute a calculating device 32 for calculating the values $\alpha$ and $\beta$ of the amplitudes of the modulation signals, as a function of $\rho_t$ and $\gamma$.

Finally, the calculating devices 31, 32 constitute second calculating means for calculating the values of $\alpha$ and $\beta$ as a function of the polar coordinates of the rotating vector representing the signal to be demodulated and the times at which the signal is sampled.

The embodiment described hereinbefore makes it possible to demodulate the chrominance signal of a PAL video frequency signal. This chrominance signal, whose frequency spectrum extends from 3.1 to 5.5 MHz results from the amplitude modulation of two subcarriers of the same frequency F equal to 4.4 MHz, but phase-displaced from one another by 90°.

Like all television signals, the PAL television signal is constituted by a luminance signal, a chrominance signal, a field synchronization signal and a line synchronization signal.

Besides these signals, the line synchronization signal is accompanied by a colour synchronization signal, also called a burst. This burst is constituted by a sequence of sine-wave signals at the precise frequency F of the chrominance subcarrier and of constant amplitude.

The operation of this digital demodulator will be better understood from a simple theoretical development, whose main stages will now be given.

The algebraic expression of the instantaneous amplitude y(t) of a chrominance signal of a PAL video frequency signal is as follows:

(1) $\quad y(t)=A(t)\cdot \cos \omega t + B(t) \cdot \sin \omega t \quad \omega=2\pi F$ \quad (1)

The terms $\cos \omega t$ and $\sin \omega t$ respectively correspond to the first subcarrier and the second subcarrier of the same pulsation ω and phase-displaced by 90° from one another.

The terms A(t) and B(t) correspond to the amplitude modulation signals of the two subcarriers.

The algebraic expression of the instantaneous amplitude x(t) of the burst is as follows:

$$x(t) = C \cos(\omega t + \psi_o)$$

In this expression, C represents a constant, $\psi_o$ corresponds to the phase displacement between the burst and the first subcarrier, the value of $\psi_o$ being 135°.

During a cycle equal to (1/F), the variations of the modulation signals are sufficiently low that the terms A(t) and B(t) can be considered as constants.

Thus, over a subcarrier cycle it is assumed:

$$\begin{cases} A(t) = \alpha \\ B(t) = \beta \end{cases}$$

α and β corresponding to constants.

Thus, the algebraic expression ① then becomes:

$$y(t) = \alpha \cos \omega t + \beta \sin \omega t. \qquad ②$$

The demodulation of a signal whose amplitude is given by expression ② succeeds in determining the values of α and β.

We will consider the values $$y\left(t - \frac{1}{4F}\right)$$

and y(t) of the amplitude of the chrominance signal at times $$t - \frac{1}{4F} \text{ and } t.$$

The expressions of $$y\left(t - \frac{1}{4F}\right)$$

and y(t) are as follows:

$$y\left(t - \frac{1}{4F}\right) = \alpha \cos\left(\omega t - \frac{\pi}{2}\right) + \beta \sin\left(\omega t - \frac{\pi}{2}\right)$$

$$= \sqrt{\alpha^2 + \beta^2} \cos\left(-\omega t + \text{arctg} \frac{\beta}{\alpha} + \frac{\pi}{2}\right)$$

$$y(t) = \alpha \cos(\omega t) + \beta \sin(\omega t)$$

$$= \sqrt{\alpha^2 + \beta^2} \sin\left(-\omega t + \text{arctg} \frac{\beta}{\alpha} + \frac{\pi}{2}\right)$$

In the same way, the values $$x\left(t - \frac{1}{4F}\right)$$

and x(t) of the burst amplitude at times t−(1/4F) and t have the expressions:

$$\begin{cases} x\left(t - \frac{1}{4F}\right) = C \cos\left(-\omega t - \phi_o + \frac{\pi}{2}\right) \\ x(t) = C \sin\left(-\omega t - \phi_o + \frac{\pi}{2}\right) \end{cases}$$

We will now consider the conventional trigonometric circle of orthogonal axes OX and OY and the vectors $\vec{OM_t}$ and $\vec{OS_t}$ of respective components $$\left[y\left(t - \frac{1}{4F}\right), y(t)\right] \text{ and } \left[x\left(t - \frac{1}{4F}\right), x(t)\right]$$

in the OXY coordinate.

The polar coordinates $(\rho_t, \theta_t)$ of vector $\vec{OM_t}$ and the polar coordinates $(\mu_t, \psi_t)$ of vector $\vec{OS_t}$ have as expressions:

$$\begin{cases} \rho_t = \sqrt{y^2\left(t - \frac{1}{4F}\right) + y^2(t)} = \sqrt{\alpha^2 + \beta^2} \\ \theta_t = \text{arctg} \frac{y(t)}{y\left(t - \frac{1}{4F}\right)} = -\omega t + \text{arctg} \frac{\beta}{\alpha} + \frac{\pi}{2} \end{cases} \qquad ③ \\ ④$$

$$\begin{cases} \mu_t = \sqrt{x^2\left(t - \frac{1}{4F}\right) + x^2(t)} = C \\ \psi_t = \text{arctg} \frac{x(t)}{x\left(t - \frac{1}{4F}\right)} = -\omega t - \phi_o + \frac{\pi}{2} \end{cases} \qquad ⑤ \\ ⑥$$

Formula ④ does not make it possible to directly deduce arctg β/α from the values of y(t) and $$y\left(t - \frac{1}{4F}\right).$$

Thus, the term ωt is dependent on the initial sampling time $t_o$. This term is eliminated by combining equations ④ and ⑥, leading to the following system of equations:

$$\begin{cases} \sqrt{\alpha^2 + \beta^2} = \rho_t \\ \text{arctg} \frac{\beta}{\alpha} = \theta_t - \psi_t - \phi_o = \gamma \end{cases} \qquad ⑦$$

The values of α and β are then given by the following expressions:

$$\begin{cases} \alpha = \rho_t \cos \gamma & (8) \\ \beta = \rho_t \sin \gamma & (9) \end{cases}$$

As the frequency and the amplitude of the burst are fixed, it should be noted that at all times $t_2+(n/F)$ (n being a positive integer and $t_2$ a random time), $\psi_t$ assumes an identical value $\psi_{t2}$, that at times $t_2+(n/f)+(1/4F)$, $\psi_t$ assumes the value $\psi_{t2}-\pi$, that at times $t_2+(n/F)+(3/4F)$, $\omega_t$ assumes the value $\psi_{t2}-(3\pi/2)$.

Thus, for times $t_o+n/F+P/4F$, formula ⑦ can be replaced by the following formula ⑩ (in which P can assume the value 0 or 1 or 2 or 3): arctg $$\frac{\beta}{\alpha} = \theta_{t2} + \frac{n}{F} + \frac{P}{4F} - \psi_{t2} + P\frac{\pi}{2} - \phi_o = \gamma \quad (10)$$

In practice, the process for the demodulation of a PAL chrominance signal according to the invention consists of sampling the burst and the chrominance signal at a rythm equal to 4 times the subcarrier frequency F, storing each sample for time (1/4F), calculating at each sampling time t the polar coordinates of the vector having two components: either $$\left[ x(t), x\left(t - \frac{1}{4F}\right) \right]$$

for the burst (formulas 5 and 6) or $$\left[ y(t), y\left(t - \frac{1}{4F}\right) \right]$$

for the chrominance signal (formulas 3 and 4), determining the value of $\gamma$ according to the formula 7 at each sampling time and then calculating the values of $\alpha$ and $\beta$ on the basis of the equations 8 and 9.

With regards to the values $\psi_t$ of the polar angle of the vector associated with the burst, it is merely necessary to calculate its value $\psi_{to}$ at times $t_o+(n/F)$ ($t_o$ corresponding to the initial sampling time) and deduce its values at the sampling times $t_o+n/F+P/4F$ by rotation of $$P\frac{\pi}{2} = \psi_{to} + \frac{n}{F} + \frac{P}{F} = \psi_{to} - P\frac{\pi}{2}$$

in such a way that the determination of the value of $\gamma$ takes place with the aid of formula ⑩ by replacing $t_2$ and $t_o$.

The operation of the device described in the drawing is as follows:

The PAL video frequency signal received at the input terminal 1 is filtered by the filter 2 to select only the chrominance signal. This filter is a 3.1 MHz–5.5 MHz band pass, which corresponds to the frequency spectrum of the chrominance signal. The signal obtained at the output of filter 2 is sampled from the initial time $t_o$ by sampler 3 in accordance with the sampling frequency 4F supplied by the clock circuit 22. The samples are then converted into binary signals by the analog-digital converter 4.

The delay element 5 delays the sample supplied by converter 4 for a period of $\tau=1/4F$. At a random sampling time $t_1$, the calculating devices 6 and 7 receive at their inputs the digital value of a signal sample $V(t_1)$ and the digital value of a signal sample $V(t_1-1/4F)$ supplied by the delay element 5.

The calculating device 6 makes it possible to calculate the vector model $z(t_1)$ of coordinates $$\left[ V(t_1), V\left(t_1 - \frac{1}{4F}\right) \right]$$

in the OXY coordinate. Calculating device 7 makes it possible to calculate the polar angle of this vector $z(t_1)$.

The signal present at the output of filter 2 corresponds either to the burst or to the chrominance signal. The determination of the values $\alpha$ and $\beta$ corresponding to the two amplitude modulation signals is carried out with the aid of the theoretical formulas ⑧ and ⑨.

The application of these formulas requires the calculation of the polar coordinates of the vectors associated with the chrominance signals, as well as the calculation of the polar angle of the vectors associated with the burst at times $t_o+n/F$. For this purpose, detection means 30 detect the burst and supply a control signal throughout the detection period. Detection is carried out by means of two detection circuits 8 and 9.

Circuit 8 supplies a first control signal when the amplitude value calculated by the calculating device 6 is identical to a theoretical amplitude value of the burst. Circuit 9 compares the angle values supplied by the calculating device 7 at times spaced by a period 1/F. When, over several successive comparisons, the variation in the values remains below a fixed threshold circuit 9 supplies a second control signal. The first and second control signals make it possible to unblock the AND gate 10, which supplies the control signal indicating the presence of the burst.

As from the initial sampling time, counter 21, included in calculating device 31, supplies a number I of value 00 at times $t_o+(n/F)$, of value 01 at times $t_o+(n/F)+(1/4F)$, of value 10 at time $t_o+(n/F)+(2/4F)$, and of value 11 at time $t_o+n/F+(3/4F)$.

The averaging device 11 forms an average for five periods of duration 1/F of the angle values supplied by calculating device 7 when the burst has been detected by detection means 30. Averaging device 11 only takes account of the angle values calculated at times $t_o+n/F$, i.e. whenever counter 21 supplies to the validation input of averaging device 11 a binary number, whose value is 00. These values correspond to the value $\psi_{to}$.

At the end of the burst, averaging device 11 supplies the calculating circuit 12 with an estimated value for the polar angle $\psi_{to}$ of the vectors associated with the burst at times $t_o+(n/F)$.

Memory 23 comprises four locations respectively storing the values 135°, $\pi/2-135°$, $\pi-135°$ and $3\pi/2-135°$.

As from the initial time $t_o$ counter 21 makes it possible to read the values stored in memory 23 in such a way that the output of memory 23 supplies the value $-135°$ at time $t_o+n/F$, the value $\pi/2-135°$ at times $t_o+(n/F)+(1/4F)$, the value $\pi-135°$ at times $t_o+(n/F)+(2/4F)$ and the value $3\pi/2-135°$ at time $t_o+(n/F)+(3/4F)$. These values are supplied to the third input on calculating circuit 12.

Thus, for the chrominance signal, calculating circuit 12 carries out the calculation of the value of angle $\gamma$ on the basis of formula ⑩ every 1/4F. Then, the calculating devices 13 and 14 respectively calculate the value of $\sin \gamma$ and of $\cos \gamma$. Finally, multipliers 15 and 16 calculate the values of $\alpha$ and $\beta$ on the basis of formulas ⑧ and ⑨. These values are then stored in memories 17, 18, after which they are supplied to the output terminals 19, 20.

The invention is not limited to the described and represented embodiment and numerous variants thereof are possible.

In particular, the functions carried out by the delay element 5, the calculating devices 6 and 7, the detection means 30, the calculating device 31 and the calculating device 32 can be carried out by means of charge transfer devices (called C.T.D) whereby the analog-digital converter 4 is then eliminated.

In the embodiment described, the chrominance signal is sampled at a rhythm equal to four times the frequency F equal to 4.4 MHz. However, the sampling rhythm value can be made equal to m times the frequency F (m positive real). The end of the rotating vector associated with the signal is then displaced over an ellipse, whose eccentricity increases with the frequency swing.

It is also pointed out that the respective positions of filter 2, sampler 3 and analog-digital converter 4 can be reversed.

Finally, it is important to note that the invention is applicable as to any signal resulting from an amplitude modulation, with suppressed carrier, of two carriers having the same frequency F and in phase quadrature.

In particular, the invention is applicable to an N.T.S.C video frequency signal by replacing formula ② in the theoretical development by the following formula:

$$y(t) = \alpha \cos(\omega t + \psi_o) + \beta \cos(\omega t + \psi_o + \pi/2)$$

with $\phi_o$ equal to 33° and by taking as the expression for the burst amplitude the following equation:

$$x(t) = C \cos(\omega t)$$

What is claimed is:

1. A process for the demodulation of an amplitude modulated signal composed of two suppressed carriers, at a same frequency F and in phase quadrature, which are respectively modulated by two modulation signals, comprising the steps of:

determining polar coordinates $(\rho_t, \theta_t)$ of a rotating vector representing the modulated signal, at time t, by calculating:

$$\rho_t = \sqrt{y^2\left(t - \frac{1}{4F}\right) + y^2(t)}$$

$$\theta_t = \text{arctg} \frac{y(t)}{y\left(t - \frac{1}{4F}\right)}$$

where $y(t)$ and $y(t-(1/4F))$ are values of two successive samples of the modulated signal;

calculating a value $\gamma$ of the difference between the polar angle $\theta_t$ of the rotating vector representing the modulated signal and the polar angle of a rotating vector representing a reference signal at a frequency F;

calculating values $\alpha$ and $\beta$ of the instantaneous amplitudes of the modulation signals according to the formulas:

$$\alpha = \rho_t \cos \gamma$$

$$\beta = \rho_t \sin \gamma$$

generating two signals whose instantaneous amplitudes are $\alpha$ and $\beta$.

2. A process for the demodulation according to claim 1, the modulated signal being preceded by a reference signal at frequency F, comprising furthermore the steps of:

sampling the reference signal according to the frequency m.F (m being an integer);

determining a polar angle $\psi_t$ of a rotating vector representing the reference signal, at time t, by calculating:

$$\psi_t = \text{arctg} \frac{x(t)}{x\left(t - \frac{1}{4F}\right)},$$

where $x(t)$ and $x(t-(1/4F))$ are the values of two successive samples of the reference signal;

calculating $\gamma$ by the formula:

$\gamma = \theta_t - \psi_t - \phi_o$ where $\psi_o$ is the phase displacement between the reference signal and one of the carriers.

3. A demodulator, using the process according to claim 2, comprising:

a sampler, for sampling the modulated signal at a frequency m.F, having an output;

an analog-digital converter having an input connected to the output of the sampler;

a delay element, of delay equal to 1/m.F, having an input connected to the output of the converter and having an output;

first calculating means for calculating the polar coordinates $(\rho_t, \theta_t)$, having two inputs respectively connected to the output of the converter and to the output of the delay element, and having two outputs; and second calculating means, for calculating the values $\alpha$ and $\beta$ of the amplitudes of the two modulation signals, having two inputs respectively connected to the two outputs of the first calculating means and having two outputs.

4. A demodulator according to claim 3, wherein m is equal to 4; wherein the first calculating means comprise a first and a second calculating device each having two inputs respectively connected to the two inputs of the first calculating means and receiving respectively values $y(t)$ and $y(t-1/4F)$, and having two outputs, for calculating the values $\rho_t$ and $\theta_t$ according to formulas:

$$\rho_t = \sqrt{y^2(t) + y^2\left(t - \frac{1}{4F}\right)}$$

-continued
$$\theta_t = \text{arctg} \frac{y(t)}{y\left(t - \frac{1}{4F}\right)}$$

and supplying these values at the two outputs respectively.

5. A demodulator according to claim 4, comprising furthermore means for detecting a reference signal preceding the modulated signal, having two inputs respectively connected to the outputs of the first calculating means and having an output; and wherein the second calculating means comprise:

a first calculating device having a first input connected to the output of the means for detecting a reference signal, a second input connected to the output of the first calculating means supplying the value $\theta_t$, and an output, for calculating a value $\gamma$ in accordance with the formula $\gamma = \theta_t - \psi_t - \phi_0$;

a second calculating device having a first input connected to the output of the first calculating means supplying the value $\rho_t$, a second input connected to the output of the first calculating device of the second calculating means and receiving the value $\gamma$, and having two outputs, for calculating $\alpha$ and $\beta$ in accordance with the formulas:

$$\alpha = \rho_t \cos \gamma$$

$$\beta = \rho_t \sin \gamma.$$

* * * * *